United States Patent [19]

Siess

[11] Patent Number: 5,420,437

[45] Date of Patent: May 30, 1995

[54] METHOD AND APPARATUS FOR GENERATION AND IMPLANTATION OF IONS

[76] Inventor: Harold E. Siess, 8629 Welbeck Way, Gaithersburg, Md. 20879

[21] Appl. No.: 179,710

[22] Filed: Jan. 11, 1994

[51] Int. Cl.$^6$ .............................................. H01J 27/00
[52] U.S. Cl. ................................ 250/492.3; 250/423 R
[58] Field of Search ............... 250/492.3, 423 R, 424, 250/425, 423 F

[56] References Cited

U.S. PATENT DOCUMENTS 3,864,575  2/1975  Hashmi et al. .................. 250/423 R

*Primary Examiner*—Paul M. Dzierzynski
*Assistant Examiner*—Kiet T. Nguyen
*Attorney, Agent, or Firm*—William H. Holt

[57] ABSTRACT

A surface ion source creates a high purity ion beam of molecules of metal compounds having a lower ionization energy than the metal they contain. Low energy dispersion in the ion beam and currents on the order of one ampere are attainable over long duration operation. Rhenium is used in the ion source and related catalyzer. Temperatures vary in the range of 700 to 2500 degrees centigrade and a preferred vacuum pressure of $10^{-5}$ torr, or lower, is used. Wear and corrosion resistance of a wide variety of materials is greatly enhanced through ion deposition and/or implantation with the disclosed apparatus and methods.

21 Claims, 1 Drawing Sheet

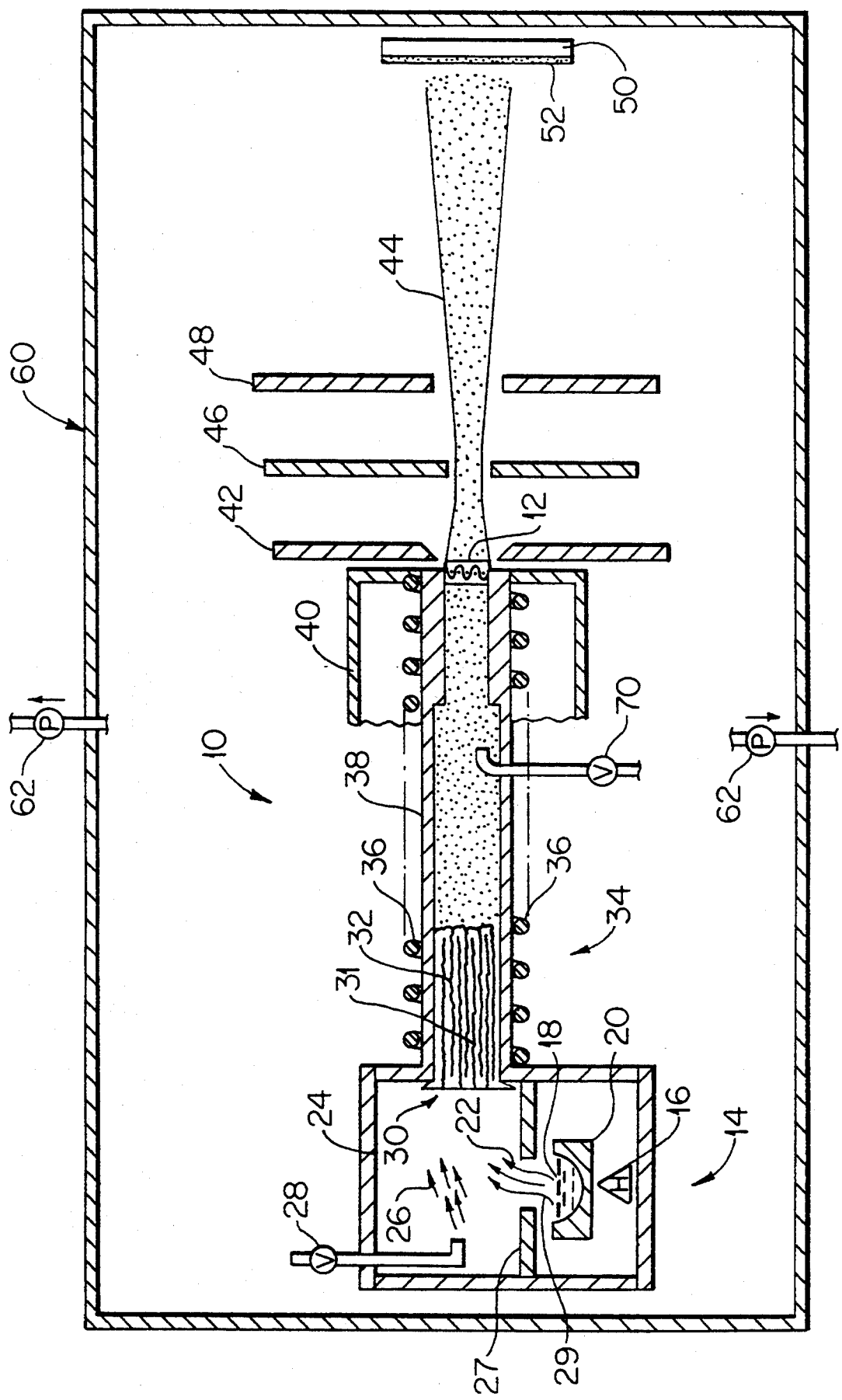

METHOD AND APPARATUS FOR GENERATION AND IMPLANTATION OF IONS

This invention relates to the generation and implantation of ions and more particularly to and improved methods and apparatus wherein a surface ionization ion source is utilized, and ions are formed of materials comprising compounds having a lower ionization energy than a metal that they contain.

BACKGROUND OF THE INVENTION

Ion sources which have been used in the past for ion implantation, particularly for ions of the rare earths, cannot produce high-current, metal-ion beams above about ten milliamperes. These known ion sources also produce a large amount of impurity ions and, therefore, the use of mass analysis is necessary for purifying the ion beam. Such purification processes substantially increase the costs and lower the production rates for finished materials.

Heretofore, a common ion source was one typified as being of the magnetron type. Magnetic fields are featured in many ion source designs to help create stable plasmas and to increase the ionization efficiency of the ions within the source. As a rule, the electrons are held in an oscillating or circulating motion between an anode and cathode until they lose an appreciable part of their energy by excitation or ionization collisions. Subsequently, the electrons reach the anode and thus form the anode current of the source. The ions generated in ionizing collisions, after extraction from this source by an extracting field, form the ion beam current.

In one magnetron type of ion source, referred to as the Harwell-Freeman source, the ion source reaches a temperature of about 1100 degrees centigrade. Thus, refractory metals must be ionized in the form of their volatile chlorides. It is usually essential to use completely anhydrous chlorides for ion source operation. Even small traces of water will prolong the source outgassing and in many cases will result in the conversion of some of the chloride to involatile oxychloride or oxide on heating in vacuum. The polyvalent chlorides present a more serious problem because of the difficulties of chemical synthesis and because many of them are extremely hydroscopic. Most of these chloride vapors are very reactive at elevated temperatures which strongly influence the life and reliability of the constructional components which form the apparatus.

The foregoing known method of ionization has several disadvantages for use in ion implantation, namely, the method produces only a few milliamperes of current; the variety of ionic species formed in this source makes magnetic separation of the beam indispensable thus increasing the costs associated with implantation applications; and many physical parameters intervene in the operation of such a source making it difficult to control and limiting its operational life.

SUMMARY OF THE INVENTION

The present invention employs surface ionization. The attractiveness of surface ionization resides in its simplicity, particularly in the required apparatus which is generally comprised of an oven, a hot metal surface and an extraction electrode which suffice for the production of quite intense beams of mono-energetic ions. Under high vacuum conditions, on the order of $10^{-5}$ torr, surface ionization ion sources are capable of delivering singularly charged ions with a minimum of impurities and low energy spread. Therefore, the costs and expense of subsequent beam analysis is not required. Furthermore, such an ion beam can be readily controlled over a wide range of current densities and acceleration voltages and the source does not suffer from the beam defocusing effects characteristic of certain discharge sources.

The benefits of the ion source of the present invention can be summarized as follows:

(1) Ion currents are attainable in the range of one ampere;
(2) Long duration of operation, in a range from hundreds to thousands of hours;
(3) Low energy dispersion in the ion beam because energy dispersion is just the thermal effect related to the temperature of the source, and is on the order of about 0.2 electron volts (0.2 eV);
(4) High purity of the ion beam, thus avoiding the need to use magnetic separation before ion deposition or implantation;
(5) Allows for production of a broad, i.e., large in cross-sectional area, ion beam; and
(6) Provides the ability for simultaneously implanting metals and non-metals in the form of molecular ions.

The invention has a myriad of uses including providing enhanced wear and corrosion resistance to materials such as lens for timepieces, light transmitting members such as eyeglasses or vehicle windows and windshields, machine tool surfaces, leading edges of turbine blades and aircraft wings and the like, and surfaces subjected to heat, friction and wear such as automobile engine and rocket components. The invention is also useful for modifying the coefficient of friction of surfaces, changing the optical properties of materials, and useful for obtaining high purity substances.

BRIEF DESCRIPTION OF THE DRAWING

The drawing schematically illustrates apparatus, partly in section, for practicing the present invention.

DETAILED DESCRIPTION OF THE INVENTION

The performance of a surface ionization ion source depends mainly on the nature and shape of the emitting surface. In order to obtain a high ionic current, the emitting surface must present a large surface area and allow a high vapor flow rate over or through it. To achieve this, different types of surface ion sources were designed, namely, (1) a sheet, or flat metal surface, and (2) a porous surface ion source, which may be either a porous wire cloth, such as a screen, or a porous powder compact, such as a sintered body. However some metals, rhenium being one example, recrystallize at a lower temperature than needed to obtain a space charge limited current, so that sintered powder compacts may not be appropriate in such instances; accordingly, at the present time, the preferred surface ion source utilized with the present invention is a wire cloth. This is particularly true for ionization processes of inorganic molecules. The use of wire cloth offers a number of advantages for the construction of porous ionizers. Among the benefits would be that of producing large surfaces possessing a high degree of uniformity and dimensional stability. Also, large surface ionizers can be constructed at favorable costs. Further, the use of wire cloth for forming the surface ion source has the advantage that it can be readily heated by using resistance heating apparatus.

Ionization of a molecule at the surface of a metal will proceed in three discrete steps. First, the atom, while approaching the surface of the metal will be polarized by the image forces between its nucleus and the free electrons inside the metal. The atom will adhere to the surface under the action of these forces. In the second step, the adsorbed atom, or molecule, has a probability of making a transition from a neutral state to an ionic state provided that the work function of the metal is greater than the ionization energy of the atom or molecule. The third step will occur only if the temperature of the metal is high enough to make the ions desorb; that is, if the temperature is sufficiently high, the adsorbed ions will accumulate enough energy to overcome the binding forces, and the ions will leave the surface. The control of the emerging ion beam can be exercised by suitable electrodes.

This model of the ionization process infers that the ion input per unit of surface area (i.e., the current density) of a surface ion source is a function of various parameters: first, the difference between the work function of the metal and the ionization energy of the impinging atoms or molecules; second, the sitting, or resident, time of the adsorbed ions, this being a function of the surface temperature and the binding force between the ions and the surface; third, in the case of molecular ion formation on the surface, the surface coverage and the enthalpy of formation; fourth, space charge effects; and fifth, the structure of the ion source.

The drawing illustrates an ionization apparatus, generally indicated by the numeral 10, which includes a surface ion source 12 shown as being in the form of a wire screen. It is to be understood, for the reasons given above, that the surface ion source 12 may also be in the form of a porous powder compact. In a preferred form of the invention, surface ion source 12 is formed of essentially pure rhenium, whether in the form of a wire screen or a porous, sintered powder compact.

A mixing chamber, generally indicated by the numeral 14, includes a heat source 16 for vaporizing a substantially purified starting material 18 which may, for example, be a substantially pure metal and may, more particularly, be selected from the rare earths, and including the lanthanides, yttrium, cerium, praseodymium, neodymium, samanium, uranium, gadolinium, terbium, scandium, actinium, zirconium, titanium, and the alkaline earths, and the monoxides thereof, the starting material 18 being contained in a crucible 20. Starting material 18 becomes vaporized because of the heat source 16 operating at a sufficiently high temperature so that vapors thereof, indicated by the arrows 22, enter into an upper portion or plenum 24, of chamber 14, wherein the vapors 22 may be mixed with a reactant gas, indicated by the arrows 26, introduced through a first valve 28. Mixing chamber 14 and plenum 24 are shown in the drawing as being divided by plate 27 which includes an aperture 29 for allowing vapors 22 to pass therethrough; it is to be understood that plate 27 may be omitted, if desired.

It is to be understood that the molecules may be selected from the group consisting of monovalent and divalent rare earths, monovalent alkaline earths, monovalent, divalent and trivalent species of titanium and zirconium, the divalent and tetravalent species of uranium, and the organo-metallics.

In one form of the invention, the reactant gas 26 is purified oxygen which, together with vapors 22, flows through a tortuous passageway, generally indicated by the numeral 30. In one form of the invention, tortuous passageway 30 is defined by a surface catalyzer 31 which contains a plurality of small-dimensioned tubes 32 formed of substantially pure rhenium; in another form of the invention, surface catalyzer 31 may be formed by or contain a plurality of plates, or sheets, also preferably formed of substantially pure rhenium. The purpose and function of tortuous passageway 30, through surface catalyzer 31, is to assure that the atoms or molecules of vapors 22 and reactant gas 26 impinge upon the walls of the rhenium plates, or sheets, or tubes 30, which act as a catalyzer means for catalytically forming molecules which have a lower ionization energy than the starting material 18. Any adsorption of vapors 22 and reactant gas 26 upon the plates, sheets or tubes 30 will create an adsorbed phase-vapor phase interface; a vaporizer heater 34 is provided, and is shown as being comprised of, for example, a rf-coil, or resistance-coil 36 which extends along a feed chamber 38 substantially the full length thereof from the plenum 24 up to the surface ion source 12. Heater 34, which is used to heat the rhenium plates, or sheets, or tubes 30, of catalyzer 31, to a temperature in the range of about 700° C. to about 2500° C., is shown as being contained within an insulative heat shield 40.

As previously described, surface ion source 12 may be heated by resistance heating, for example, through use of an electric circuit (not shown). A voltage on the order of one kilovolt or greater applied to the surface ion source 12 is to operate at a temperature at or above that of the surface catalyzer 31 to ensure the production of molecular ions greater than one milliampere for creating a high current density. It will be understood that the upper temperature of the surface ion source 12 must be less than the melting point of the material of which it is composed.

A beam-forming electrode 42 is provided adjacent to surface ion source 12 on the side thereof remote from the feed chamber 38 for causing ions to be driven, extracted, drawn or expelled from source 12 in the form of an emerging ion beam 44. An acceleration electrode 46 and a deceleration electrode 48 are provided to control ion beam 44 so that the ions impinge upon a substrate 50 with a desired velocity and across a desired area greater than $10^{15}$ ions per square centimeter for forming an ion layer 52. It will be understood that ion layer 52 may be created by a plurality of ions being deposited upon the surface of substrate 50; likewise, it will be understood that ion layer 52 may be created by a plurality of ions being implanted into the material of substrate 50 by imparting sufficient energy to ion beam 44 so that the individual ions reach the surface of substrate 50 with the required velocity for causing implantation rather than mere surface deposition.

Ionization apparatus 10 is operated within an enclosed pressure chamber, or compartment, or room, or other form of enclosure, generally indicated by the numeral 60. Chamber 60 is evacuated to a pressure level on the order of lower than $10^{-5}$ torr or lower by one or more high velocity vacuum pumps 62, which may be, for example, turbomolecular vacuum pumps; a vacuum of this magnitude will allow quite satisfactory performance of the ionization process and operation of the ionization apparatus 10 which comprise the present invention and will avoid arcing problems that occur at higher pressures.

A second valve 70, similar to first valve 28, provides a second inlet for introducing gaseous matter into the feed chamber 38 for mixing with the atoms and molecules flowing therethrough. Gas introduced through valve 70 is usually oxygen, and is particularly used whenever halogens, or pseudo-halogens, or mixtures of either thereof with oxygen, are introduced through valve 28 and used for forming the halides or forming the metal oxide ions. This additional supply of oxygen through valve 70 is used with the halogens for the purpose of raising the work function of the surface ion source 12. Further, such oxygen is very useful for removing impurities, typically molybdenum and tantalum, from the rhenium wire screen of surface ion source 12 as well as removing these impurities from the starting material 18.

The foregoing description is directed to preferred embodiments of the present invention and to the presently contemplated best mode of apparatus and process steps for performing the invention. It is, of course, understood that various modifications and changes may be made without departing from the spirit and scope of the invention which are to be determined in accordance with the following claimed subject matter.

I claim:

1. Apparatus for generating molecular ions, said apparatus including container means for containing a gaseous ion source material comprised of a metal, means for chemically synthesizing the gaseous ion source material in the form of molecules of a metal compound having a lower ionization energy than the metal that it contains, and means for ionizing said molecules.

2. Apparatus as defined in claim 1 wherein said metal compound is selected from the group consisting of compounds of the lanthanides, yttrium, scandium, actinium, zirconium, titanium, and the alkaline earths.

3. Apparatus as defined in claim 1 wherein said metal compound is selected from the group consisting of the monoxides of lanthanum, yttrium, cerium, praseodymium, neodymium, samarium, uranium, gadolinium, terbium, scandium, actinium, zirconium and titanium.

4. Apparatus as defined in claim 1 wherein said means for chemically synthesizing the gaseous ion source material is comprised of a surface catalyzer.

5. Apparatus as defined in claim 4 wherein said surface catalyzer is comprised of rhenium.

6. Apparatus for generating ions, said apparatus comprising container means for containing metal material to be ionized, vaporizing means for vaporizing said metal material, a mixing chamber and a passageway connected thereto for transporting said vaporized metal material from said container and through said mixing chamber, means for introducing reactant means into said mixing chamber and said passageway for creating molecules of a metal compound having a lower ionization energy than said metal, a surface ion source located downstream of said passageway for ionizing said molecules, and means for causing said ionized molecules to emerge from said surface ion source.

7. Apparatus as defined in claim 6 including means for heating said surface ion source to a temperature in excess of 700 degrees C. but less than the melting point thereof.

8. Apparatus as defined in claim 6 wherein said surface ion source is formed of rhenium.

9. Apparatus as defined in claim 6 wherein said passageway is defined by surface catalyzer members formed of rhenium.

10. Apparatus as defined in claim 6 including said mixing chamber comprises a plenum located between said container means and said passageway, and said reactant means for introducing into said plenum a gas selected from the group consisting of oxygen, the halogens and pseudo-halogens.

11. Apparatus as defined in claim 6 wherein said means for causing said ionized molecules to emerge from said surface ion source includes means for extracting a current output from said surface ion source greater than one milliampere of molecular ions.

12. A method for treating a substrate, said method including the steps of providing an ion source material comprised of a metal, combining said metal with a reactant for creating molecules of a metal compound having a lower ionization energy than the metal it contains, creating ions of said metal compound, and causing said ions to impinge on said substrate.

13. A method as defined in claim 12 further including the step of selecting said metal compound from the group consisting of the lanthanides, yttrium, scandium, actinium, zirconium, titanium, uranium and the alkaline earths.

14. A method as defined in claim 12 further including the step of selecting said reactant from the group consisting of oxygen, the halogens and the pseudo-halogens.

15. A method as defined in claim 12 further including the steps of providing a mixing chamber and a passageway connected to said mixing chamber, creating a vacuum in an enclosed pressure chamber containing said mixing chamber and said passageway, said step of combining said metal with said reactant including the step of creating a metal vapor of said ion source material, introducing said metal vapor and said reactant into said passageway for forming said molecules, depositing said molecules upon a surface ion source located adjacent said passageway for producing ions of said molecules, and applying a voltage across said surface ion source for extracting said ions therefrom.

16. A method as defined in claim 15 wherein said voltage is on the order of one kilovolt or higher, and said method includes the addition step of providing a vacuum on the order of $10^{-5}$ torr adjacent said surface ion source on the side thereof remote from said passageway.

17. A method as defined in claim 12 further including the step of producing a current of said ions in excess of one milliampere.

18. The method as defined in claim 12 wherein the step of causing said ions to impinge on said substrate includes the step of causing said ions in excess of $10^{15}$ ions per square centimeter to impinge on said substrate.

19. A method of treating a substrate with ions, said method comprising the steps of providing a substrate to be treated, implanting said substrate with ions comprised of metal by creating ions for forming an ion stream and moving said ion stream into contact with said substrate, the improvement comprising the step of forming molecular ions from molecules which have a lower ionization energy than the metal they contain, and implanting the substrate with said molecular ions.

20. A method as defined in claim 19 further including the step of choosing said molecules from the group consisting of the monovalent and divalent rare earths, the monovalent alkaline earths, the monovalent, divalent and trivalent species of titanium and zirconium, the divalent and tetravalent species of uranium, and the organo-metallics.

21. The method of claim 20 further including the step of introducing gaseous oxygen for forming metal oxide ions.

* * * * *